(12) United States Patent
Metzner et al.

(10) Patent No.: US 7,569,500 B2
(45) Date of Patent: *Aug. 4, 2009

(54) ALD METAL OXIDE DEPOSITION PROCESS USING DIRECT OXIDATION

(75) Inventors: Craig R. Metzner, Fremont, CA (US);
Shreyas S. Kher, Campbell, CA (US);
Vidyut Gopal, Santa Clara, CA (US);
Shixue Han, Milpitas, CA (US);
Shankarram A. Athreya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

This patent is subject to a terminal disclaimer.

(21) Appl. No.: 11/421,283

(22) Filed: May 31, 2006

(65) Prior Publication Data

US 2006/0223339 A1    Oct. 5, 2006

Related U.S. Application Data

(62) Division of application No. 10/247,103, filed on Sep. 19, 2002.

(60) Provisional application No. 60/388,929, filed on Jun. 14, 2002.

(51) Int. Cl.
*H01L 21/31* (2006.01)

(52) U.S. Cl. .............................. 438/785; 257/E21.006; 427/249.19

(58) Field of Classification Search ................. 438/758, 438/778, 784, 785, 788; 257/E21.001, E21.006; 427/248.1, 249.19, 250, 252
See application file for complete search history.

(56) References Cited

U.S. PATENT DOCUMENTS

| | | | |
|---|---|---|---|
| 3,427,514 A | 2/1969 | Olmstead et al. |
| 3,594,295 A | 7/1971 | Meckel et al. |
| 4,043,848 A | 8/1977 | Bazin |
| 4,096,509 A | 6/1978 | Blaha et al. |
| 4,262,631 A | 4/1981 | Kubacki |
| 4,310,380 A | 1/1982 | Flamm et al. |
| 4,335,391 A | 6/1982 | Morris |

(Continued)

FOREIGN PATENT DOCUMENTS

EP        0 232 619 A2    8/1987

(Continued)

OTHER PUBLICATIONS

"A Novel Atomic Layer Deposition Process to Deposit Hafnium Silicate Thin Films", Senzaki, Yoshihide, et al., Electrochemical Society Proceedings vol. 2004-01, pp. 264-270.

(Continued)

*Primary Examiner*—Brook Kebede
(74) *Attorney, Agent, or Firm*—Patterson & Sheridan, LLP

(57) ABSTRACT

Methods of forming metal compounds such as metal oxides or metal nitrides by sequentially introducing and then reacting metal organic compounds with ozone one or with oxygen radicals or nitrogen radicals formed in a remote plasma chamber. The metal compounds have surprisingly and significantly improved uniformity when deposited by atomic layer deposition with cycle times of at least 10 seconds. The metal compounds also do not contain detectable carbon when the metal organic compound is vaporized at process conditions in the absence of solvents or excess ligands.

20 Claims, 4 Drawing Sheets

U.S. PATENT DOCUMENTS

| | | | |
|---|---|---|---|
| 4,412,119 A | 10/1983 | Komatsu et al. | |
| 4,439,463 A | 3/1984 | Miller | |
| 4,459,739 A | 7/1984 | Shepherd et al. | |
| 4,495,219 A | 1/1985 | Kato et al. | |
| 4,534,826 A | 8/1985 | Goth et al. | |
| 4,545,112 A | 10/1985 | Holmberg et al. | |
| 4,563,367 A | 1/1986 | Sherman | |
| 4,585,516 A | 4/1986 | Corn et al. | |
| 4,605,947 A | 8/1986 | Price et al. | |
| 4,608,063 A | 8/1986 | Kurokawa | |
| 4,651,185 A | 3/1987 | Holmberg et al. | |
| 4,700,458 A | 10/1987 | Suzuki et al. | |
| 4,725,560 A | 2/1988 | Abernathey et al. | |
| 4,743,953 A | 5/1988 | Toyokura et al. | |
| 4,745,082 A | 5/1988 | Kwok | |
| 4,851,370 A | 7/1989 | Doklan et al. | |
| 4,913,929 A | 4/1990 | Moslehi et al. | |
| 4,948,458 A | 8/1990 | Ogle | |
| 4,980,307 A | 12/1990 | Ito et al. | |
| 5,000,113 A | 3/1991 | Wang et al. | |
| 5,063,431 A | 11/1991 | Ohshima | |
| 5,173,442 A | 12/1992 | Carey | |
| 5,228,950 A | 7/1993 | Webb et al. | |
| 5,290,609 A | 3/1994 | Horiike et al. | |
| 5,292,673 A | 3/1994 | Shinriki et al. | |
| 5,302,236 A | 4/1994 | Tahara et al. | |
| 5,314,724 A | 5/1994 | Tsukune et al. | |
| 5,335,138 A | 8/1994 | Sandhu et al. | |
| 5,391,510 A | 2/1995 | Hsu et al. | |
| 5,464,783 A | 11/1995 | Kim et al. | |
| 5,582,866 A | 12/1996 | White | |
| 5,619,051 A | 4/1997 | Endo | |
| 5,726,087 A | 3/1998 | Tseng et al. | |
| 5,763,922 A | 6/1998 | Chau | |
| 5,834,343 A | 11/1998 | Ogasawara et al. | |
| 5,840,626 A | 11/1998 | Ohguro | |
| 5,851,602 A | 12/1998 | Law et al. | |
| 5,861,197 A | 1/1999 | Law et al. | |
| 5,865,896 A | 2/1999 | Nowak et al. | |
| 5,874,766 A | 2/1999 | Hori | |
| 5,880,508 A | 3/1999 | Wu | |
| 5,891,798 A | 4/1999 | Doyle et al. | |
| 5,916,365 A | 6/1999 | Sherman | |
| 5,928,732 A | 7/1999 | Law et al. | |
| 5,935,373 A | 8/1999 | Koshimizu | |
| 5,937,303 A | 8/1999 | Gardner et al. | |
| 5,960,270 A | 9/1999 | Misra et al. | |
| 5,976,993 A | 11/1999 | Ravi et al. | |
| 6,008,095 A | 12/1999 | Gardner et al. | |
| 6,013,553 A | 1/2000 | Wallace et al. | |
| 6,020,024 A | 2/2000 | Maiti et al. | |
| 6,020,243 A | 2/2000 | Wallace et al. | |
| 6,023,613 A | 2/2000 | Kanehara | |
| 6,027,961 A | 2/2000 | Maiti et al. | |
| 6,033,963 A | 3/2000 | Huang et al. | |
| 6,041,734 A | 3/2000 | Raoux et al. | |
| 6,043,157 A | 3/2000 | Gardner et al. | |
| 6,049,114 A | 4/2000 | Maiti et al. | |
| 6,054,013 A | 4/2000 | Collins et al. | |
| 6,060,755 A | 5/2000 | Ma et al. | |
| 6,063,704 A | 5/2000 | Demirlioglu | |
| 6,066,533 A | 5/2000 | Yu | |
| 6,077,403 A | 6/2000 | Kobayashi et al. | |
| 6,082,375 A * | 7/2000 | Gealy et al. | 134/1.1 |
| 6,083,836 A | 7/2000 | Rodder | |
| 6,087,231 A | 7/2000 | Xiang et al. | |
| 6,090,653 A | 7/2000 | Wu | |
| 6,093,590 A | 7/2000 | Lou | |
| 6,110,287 A | 8/2000 | Arai et al. | |
| 6,117,279 A | 9/2000 | Smolanoff et al. | |
| 6,130,123 A | 10/2000 | Liang et al. | |
| 6,136,654 A | 10/2000 | Kraft et al. | |
| 6,140,024 A | 10/2000 | Misium et al. | |
| 6,140,688 A | 10/2000 | Gardner et al. | |
| 6,162,709 A | 12/2000 | Raoux et al. | |
| 6,171,900 B1 | 1/2001 | Sun | |
| 6,171,910 B1 | 1/2001 | Hobbs et al. | |
| 6,174,809 B1 | 1/2001 | Kang et al. | |
| 6,184,072 B1 | 2/2001 | Kaushik et al. | |
| 6,184,114 B1 | 2/2001 | Lukanc | |
| 6,190,513 B1 | 2/2001 | Forster et al. | |
| 6,200,893 B1 | 3/2001 | Sneh | |
| 6,203,613 B1 | 3/2001 | Gates et al. | |
| 6,207,304 B1 | 3/2001 | Law et al. | |
| 6,207,487 B1 | 3/2001 | Kim et al. | |
| 6,228,229 B1 | 5/2001 | Raaijmakers et al. | |
| 6,235,650 B1 | 5/2001 | Yao | |
| 6,238,734 B1 | 5/2001 | Senzaki et al. | |
| 6,244,211 B1 | 6/2001 | Nishikawa et al. | |
| 6,254,738 B1 | 7/2001 | Stimson et al. | |
| 6,254,746 B1 | 7/2001 | Subramani et al. | |
| 6,255,231 B1 | 7/2001 | Chen et al. | |
| 6,255,698 B1 | 7/2001 | Gardner et al. | |
| 6,258,675 B1 | 7/2001 | Gardner et al. | |
| 6,264,812 B1 | 7/2001 | Raaijmakers et al. | |
| 6,270,572 B1 | 8/2001 | Kim et al. | |
| 6,277,253 B1 | 8/2001 | Narasimhan et al. | |
| 6,287,635 B1 | 9/2001 | Cook et al. | |
| 6,287,965 B1 | 9/2001 | Kang et al. | |
| 6,291,282 B1 | 9/2001 | Wilk et al. | |
| 6,291,283 B1 | 9/2001 | Wilk | |
| 6,297,107 B1 | 10/2001 | Paton et al. | |
| 6,297,539 B1 | 10/2001 | Ma et al. | |
| 6,297,595 B1 | 10/2001 | Stimson et al. | |
| 6,299,294 B1 | 10/2001 | Regan | |
| 6,303,481 B2 | 10/2001 | Park | |
| 6,305,314 B1 | 10/2001 | Sneh et al. | |
| 6,306,216 B1 | 10/2001 | Kim et al. | |
| 6,320,238 B1 | 11/2001 | Kizilyalli et al. | |
| 6,342,277 B1 | 1/2002 | Sherman | |
| 6,344,419 B1 | 2/2002 | Forster et al. | |
| 6,345,588 B1 | 2/2002 | Stimson | |
| 6,346,465 B1 | 2/2002 | Miura et al. | |
| 6,348,126 B1 | 2/2002 | Hanawa et al. | |
| 6,348,386 B1 | 2/2002 | Gilmer | |
| 6,352,594 B2 | 3/2002 | Cook et al. | |
| 6,354,593 B1 | 3/2002 | Frommer et al. | |
| 6,355,108 B1 | 3/2002 | Won et al. | |
| 6,358,810 B1 | 3/2002 | Dornfest et al. | |
| 6,361,667 B1 | 3/2002 | Kobayashi et al. | |
| 6,365,450 B1 | 4/2002 | Kim | |
| 6,365,518 B1 | 4/2002 | Lee et al. | |
| 6,372,598 B2 | 4/2002 | Kang et al. | |
| 6,373,111 B1 | 4/2002 | Zheng et al. | |
| 6,376,807 B1 | 4/2002 | Hong et al. | |
| 6,391,785 B1 | 5/2002 | Satta et al. | |
| 6,391,803 B1 | 5/2002 | Kim et al. | |
| 6,395,650 B1 | 5/2002 | Callegari et al. | |
| 6,395,690 B1 | 5/2002 | Tsaur | |
| 6,399,491 B2 | 6/2002 | Jeon et al. | |
| 6,399,520 B1 | 6/2002 | Kawakami et al. | |
| 6,413,382 B1 | 7/2002 | Wang et al. | |
| 6,416,577 B1 | 7/2002 | Suntoloa et al. | |
| 6,420,279 B1 | 7/2002 | Ono et al. | |
| 6,436,801 B1 | 8/2002 | Wilk et al. | |
| 6,444,099 B1 | 9/2002 | Sasaki et al. | |
| 6,444,592 B1 | 9/2002 | Ballantine et al. | |
| 6,447,636 B1 | 9/2002 | Qian et al. | |
| 6,448,166 B2 | 9/2002 | Cho et al. | |
| 6,451,119 B2 | 9/2002 | Sneh et al. | |
| 6,451,695 B2 | 9/2002 | Sneh | |
| 6,452,229 B1 | 9/2002 | Krivokapic | |
| 6,461,483 B1 | 10/2002 | Gopalraja et al. | |
| 6,472,337 B1 | 10/2002 | Zhuang et al. | |

| | | | | | |
|---|---|---|---|---|---|
| 6,475,276 B1 | 11/2002 | Elers et al. | 6,916,398 B2 | 7/2005 | Chen et al. |
| 6,475,854 B2 | 11/2002 | Narwankar et al. | 6,919,251 B2 | 7/2005 | Rotondaro et al. |
| 6,475,908 B1 | 11/2002 | Lin et al. | 6,924,191 B2 | 8/2005 | Liu et al. |
| 6,475,910 B1 | 11/2002 | Sneh | 6,946,408 B2 | 9/2005 | Le et al. |
| 6,477,980 B1 | 11/2002 | White et al. | 6,951,804 B2 | 10/2005 | Seutter et al. |
| 6,482,262 B1 | 11/2002 | Elers et al. | 6,960,537 B2 | 11/2005 | Shero et al. |
| 6,482,752 B1 | 11/2002 | Yamazaki et al. | 6,982,230 B2 | 1/2006 | Cabral, Jr., et al. |
| 6,486,080 B2 | 11/2002 | Chooi et al. | 6,998,357 B2 | 2/2006 | Bai et al. |
| 6,497,796 B1 | 12/2002 | Ashtiani et al. | 7,023,064 B2 | 4/2006 | Park et al. |
| 6,500,742 B1 | 12/2002 | Chern et al. | 7,064,066 B1 | 6/2006 | Metz et al. |
| 6,504,214 B1 | 1/2003 | Yu et al. | 7,066,194 B2 | 6/2006 | Ku et al. |
| 6,506,287 B1 | 1/2003 | Ding | 7,067,439 B2 | 6/2006 | Metzner et al. |
| 6,506,676 B2 | 1/2003 | Park et al. | 7,084,024 B2 | 8/2006 | Gluschenkov et al. |
| 6,511,875 B2 | 1/2003 | Park et al. | 7,094,613 B2 | 8/2006 | Mui et al. |
| 6,514,828 B2 | 2/2003 | Ahn et al. | 7,094,680 B2 | 8/2006 | Seutter et al. |
| 6,524,967 B1 * | 2/2003 | Alluri ........................ 438/758 | 7,094,704 B2 | 8/2006 | Jin et al. |
| 6,528,856 B1 | 3/2003 | Bai et al. | 7,105,889 B2 | 9/2006 | Bojarczuk, Jr. et al. |
| 6,528,858 B1 | 3/2003 | Yu et al. | 7,122,454 B2 | 10/2006 | Olsen |
| 6,541,079 B1 | 4/2003 | Bojarczuk, Jr. et al. | 7,175,713 B2 | 2/2007 | Thakur et al. |
| 6,544,906 B2 | 4/2003 | Rotondaro et al. | 7,179,754 B2 | 2/2007 | Kraus et al. |
| 6,548,366 B2 | 4/2003 | Niimi et al. | 7,204,886 B2 | 4/2007 | Chen et al. |
| 6,548,368 B1 | 4/2003 | Narwankar et al. | 7,208,361 B2 | 4/2007 | Shah et al. |
| 6,551,446 B1 | 4/2003 | Hanawa et al. | 7,217,611 B2 | 5/2007 | Kavalieros et al. |
| 6,554,979 B2 | 4/2003 | Stimson | 7,217,665 B2 | 5/2007 | Nallan et al. |
| 6,599,572 B2 | 7/2003 | Saanila et al. | 7,220,635 B2 | 5/2007 | Brask et al. |
| 6,610,374 B2 | 8/2003 | Tsai et al. | 7,228,873 B2 | 6/2007 | Ku et al. |
| 6,610,615 B1 | 8/2003 | McFadden et al. | 7,235,501 B2 | 6/2007 | Ahn et al. |
| 6,617,209 B1 | 9/2003 | Chau et al. | 7,242,055 B2 | 7/2007 | Bojarczuk, Jr. et al. |
| 6,617,266 B2 | 9/2003 | Nickles et al. | 7,279,413 B2 | 10/2007 | Park et al. |
| 6,620,670 B2 | 9/2003 | Song et al. | 7,294,581 B2 | 11/2007 | Iyer et al. |
| 6,620,723 B1 | 9/2003 | Byun et al. | 7,304,004 B2 | 12/2007 | Metzner et al. |
| 6,630,201 B2 | 10/2003 | Chiang et al. | 7,402,210 B2 | 7/2008 | Chen et al. |
| 6,632,747 B2 | 10/2003 | Niimi et al. | 7,408,225 B2 | 8/2008 | Shinriki et al. |
| 6,638,877 B2 | 10/2003 | Rotondaro | 2001/0000866 A1 | 5/2001 | Sneh et al. |
| 6,641,703 B2 | 11/2003 | Nomura et al. | 2001/0002280 A1 | 5/2001 | Sneh |
| 6,649,538 B1 | 11/2003 | Cheng et al. | 2001/0009695 A1 | 7/2001 | Saanila et al. |
| 6,652,924 B2 | 11/2003 | Sherman | 2001/0021589 A1 | 9/2001 | Wilk |
| 6,653,698 B2 | 11/2003 | Lee et al. | 2001/0024387 A1 | 9/2001 | Raaijmakers et al. |
| 6,660,134 B1 | 12/2003 | Gopalraja | 2001/0029092 A1 | 10/2001 | Park et al. |
| 6,660,659 B1 | 12/2003 | Kraus et al. | 2001/0029891 A1 | 10/2001 | Oh et al. |
| 6,661,058 B2 | 12/2003 | Ahn et al. | 2001/0049186 A1 | 12/2001 | Ibok |
| 6,664,160 B2 | 12/2003 | Park et al. | 2001/0055889 A1 | 12/2001 | Iyer |
| 6,673,724 B2 | 1/2004 | Forster et al. | 2002/0000598 A1 | 1/2002 | Kang et al. |
| 6,674,138 B1 | 1/2004 | Halliyal et al. | 2002/0005556 A1 | 1/2002 | Cartier et al. |
| 6,675,816 B2 | 1/2004 | Ichijo | 2002/0008297 A1 | 1/2002 | Park et al. |
| 6,677,254 B2 | 1/2004 | Narwankar et al. | 2002/0014647 A1 | 2/2002 | Seidl et al. |
| 6,682,973 B1 | 1/2004 | Paton et al. | 2002/0015790 A1 | 2/2002 | Baum et al. |
| 6,689,646 B1 | 2/2004 | Joshi et al. | 2002/0023900 A1 | 2/2002 | Mahawili |
| 6,719,883 B2 | 4/2004 | Stimson | 2002/0029092 A1 | 3/2002 | Gass |
| 6,743,473 B1 | 6/2004 | Parkhe et al. | 2002/0043668 A1 | 4/2002 | Parsons et al. |
| 6,759,286 B2 | 7/2004 | Kumar et al. | 2002/0064970 A1 | 5/2002 | Chooi et al. |
| 6,765,178 B2 | 7/2004 | Shang et al. | 2002/0066537 A1 | 6/2002 | Ogino et al. |
| 6,767,824 B2 | 7/2004 | Nallan et al. | 2002/0076837 A1 | 6/2002 | Hujanen et al. |
| 6,777,346 B2 | 8/2004 | Iyer | 2002/0081826 A1 | 6/2002 | Rotondaro et al. |
| 6,780,720 B2 | 8/2004 | Burnham et al. | 2002/0081844 A1 | 6/2002 | Jeon et al. |
| 6,784,033 B1 | 8/2004 | Yamazaki | 2002/0086111 A1 | 7/2002 | Byun et al. |
| 6,790,755 B2 | 9/2004 | Jeon | 2002/0093046 A1 | 7/2002 | Moriya et al. |
| 6,797,108 B2 | 9/2004 | Wendling | 2002/0093781 A1 | 7/2002 | Bachhofer et al. |
| 6,803,272 B1 | 10/2004 | Halliyal et al. | 2002/0098627 A1 | 7/2002 | Pomarede et al. |
| 6,806,095 B2 | 10/2004 | Nallan et al. | 2002/0104481 A1 | 8/2002 | Chiang et al. |
| 6,806,653 B2 | 10/2004 | Strang et al. | 2002/0106536 A1 | 8/2002 | Lee et al. |
| 6,821,563 B2 | 11/2004 | Yudovsky | 2002/0142624 A1 | 10/2002 | Levy et al. |
| 6,821,873 B2 | 11/2004 | Visokay et al. | 2002/0146895 A1 | 10/2002 | Ramdani et al. |
| 6,824,658 B2 | 11/2004 | Gopalraja et al. | 2002/0151152 A1 | 10/2002 | Shimamoto et al. |
| 6,831,021 B2 | 12/2004 | Chua et al. | 2002/0153579 A1 | 10/2002 | Yamamoto |
| 6,841,439 B1 | 1/2005 | Anthony et al. | 2002/0155722 A1 | 10/2002 | Satta et al. |
| 6,846,516 B2 | 1/2005 | Yang et al. | 2002/0162506 A1 | 11/2002 | Sneh et al. |
| 6,855,643 B2 | 2/2005 | Nallan et al. | 2002/0172768 A1 | 11/2002 | Endo et al. |
| 6,858,547 B2 | 2/2005 | Metzner et al. | 2002/0175393 A1 | 11/2002 | Baum et al. |
| 6,864,145 B2 | 3/2005 | Hareland et al. | 2002/0177282 A1 | 11/2002 | Song |
| 6,866,746 B2 | 3/2005 | Lei et al. | 2002/0177293 A1 | 11/2002 | Wilk et al. |
| 6,902,681 B2 | 6/2005 | Nallan et al. | 2002/0182320 A1 | 12/2002 | Lesketa et al. |
| 6,911,399 B2 | 6/2005 | Liu et al. | 2002/0187256 A1 | 12/2002 | Elers et al. |

| | | | | | | |
|---|---|---|---|---|---|---|
| 2002/0195643 | A1 | 12/2002 | Harada | 2005/0130448 | A1 | 6/2005 | Olsen |
| 2002/0197881 | A1 | 12/2002 | Ramdanl et al. | 2005/0139160 | A1 | 6/2005 | Lei et al. |
| 2002/0197883 | A1 | 12/2002 | Niimi et al. | 2005/0173068 | A1 | 8/2005 | Chen et al. |
| 2003/0027392 | A1 | 2/2003 | Gousev et al. | 2005/0186765 | A1 | 8/2005 | Ma et al. |
| 2003/0031607 | A1 | 2/2003 | Elers et al. | 2005/0212119 | A1 | 9/2005 | Shero et al. |
| 2003/0049931 | A1 | 3/2003 | Byun et al. | 2005/0230047 | A1 | 10/2005 | Collins et al. |
| 2003/0049942 | A1 | 3/2003 | Haukka et al. | 2005/0252449 | A1 | 11/2005 | Nguyen et al. |
| 2003/0072975 | A1 | 4/2003 | Shero et al. | 2005/0260347 | A1 | 11/2005 | Narwankar et al. |
| 2003/0082296 | A1 | 5/2003 | Elers et al. | 2005/0260357 | A1 | 11/2005 | Olsen |
| 2003/0082301 | A1 | 5/2003 | Chen et al. | 2005/0271812 | A1 | 12/2005 | Myo et al. |
| 2003/0089942 | A1 | 5/2003 | Bhattachyrra | 2005/0271813 | A1 | 12/2005 | Kher et al. |
| 2003/0096473 | A1 | 5/2003 | Shih et al. | 2006/0019033 | A1 | 1/2006 | Muthukrishnan et al. |
| 2003/0104710 | A1 | 6/2003 | Viskay et al. | 2006/0030148 | A1 | 2/2006 | Seutter et al. |
| 2003/0106490 | A1 | 6/2003 | Jallepally et al. | 2006/0032833 | A1 | 2/2006 | Kawaguchi et al. |
| 2003/0109114 | A1 | 6/2003 | Niwa | 2006/0042755 | A1 | 3/2006 | Holmberg et al. |
| 2003/0116804 | A1 | 6/2003 | Visokay et al. | 2006/0060565 | A9 | 3/2006 | Nallan et al. |
| 2003/0121608 | A1 | 7/2003 | Chen et al. | 2006/0062917 | A1 | 3/2006 | Muthukrishnan et al. |
| 2003/0121886 | A1 | 7/2003 | Strang et al. | 2006/0153995 | A1 | 7/2006 | Narwankar et al. |
| 2003/0133861 | A1 | 7/2003 | Bowen et al. | 2006/0178018 | A1 | 8/2006 | Olsen |
| 2003/0143328 | A1 | 7/2003 | Chen et al. | 2006/0208215 | A1 | 9/2006 | Metzner et al. |
| 2003/0160277 | A1 | 8/2003 | Bhattachyrra | 2006/0216928 | A1 | 9/2006 | Chung et al. |
| 2003/0168750 | A1 | 9/2003 | Basceri et al. | 2006/0244035 | A1 | 11/2006 | Bojarczuk et al. |
| 2003/0173586 | A1 | 9/2003 | Moriwaki et al. | 2006/0264067 | A1 | 11/2006 | Kher et al. |
| 2003/0181012 | A1 | 9/2003 | Want et al. | 2006/0286763 | A1 | 12/2006 | Ma et al. |
| 2003/0185980 | A1 | 10/2003 | Endo | 2007/0003698 | A1 | 1/2007 | Chen et al. |
| 2003/0186495 | A1 | 10/2003 | Saanila et al. | 2007/0018244 | A1 | 1/2007 | Hung et al. |
| 2003/0188682 | A1 | 10/2003 | Tois et al. | 2007/0020890 | A1 | 1/2007 | Thakur et al. |
| 2003/0190423 | A1 | 10/2003 | Yang et al. | 2007/0026147 | A1 | 2/2007 | Chen et al. |
| 2003/0194859 | A1 | 10/2003 | Jeon | 2007/0026547 | A1 | 2/2007 | Kumar et al. |
| 2003/0205729 | A1 | 11/2003 | Basceri et al. | 2007/0042601 | A1 | 2/2007 | Wang et al. |
| 2003/0205772 | A1 | 11/2003 | Schaeffer et al. | 2007/0049043 | A1 | 3/2007 | Muthukrishnan et al. |
| 2003/0213987 | A1 | 11/2003 | Basceri et al. | 2007/0049053 | A1 | 3/2007 | Mahajani |
| 2003/0227033 | A1 | 12/2003 | Ahn et al. | 2007/0059948 | A1 | 3/2007 | Metzner et al. |
| 2003/0230549 | A1 | 12/2003 | Buchanan et al. | 2007/0077767 | A1 | 4/2007 | Jin et al. |
| 2003/0232491 | A1 | 12/2003 | Wamaguchi | 2007/0087583 | A1 | 4/2007 | Olsen et al. |
| 2003/0232501 | A1 | 12/2003 | Kher et al. | 2007/0093012 | A1 | 4/2007 | Chua et al. |
| 2003/0232506 | A1 | 12/2003 | Metzner et al. | 2007/0095285 | A1 | 5/2007 | Thakur et al. |
| 2003/0232511 | A1 | 12/2003 | Metzner et al. | 2007/0099438 | A1 | 5/2007 | Ye et al. |
| 2003/0234417 | A1 | 12/2003 | Raaijmakers et al. | 2007/0111458 | A1 | 5/2007 | Sato et al. |
| 2003/0235961 | A1 | 12/2003 | Metzner et al. | 2007/0119370 | A1 | 5/2007 | Ma et al. |
| 2004/0007747 | A1 | 1/2004 | Visokay et al. | 2007/0119371 | A1 | 5/2007 | Ma et al. |
| 2004/0009307 | A1 | 1/2004 | Koh et al. | 2007/0128862 | A1 | 6/2007 | Ma et al. |
| 2004/0009675 | A1 | 1/2004 | Eissa et al. | 2007/0128863 | A1 | 6/2007 | Ma et al. |
| 2004/0016723 | A1 | 1/2004 | Byun et al. | 2007/0128864 | A1 | 6/2007 | Ma et al. |
| 2004/0016747 | A1 | 1/2004 | Lee et al. | 2007/0141856 | A1 | 6/2007 | Sato et al. |
| 2004/0016973 | A1 | 1/2004 | Rotondaro et al. | 2007/0199922 | A1 | 8/2007 | Shen et al. |
| 2004/0023461 | A1 | 2/2004 | Ahn et al. | 2007/0209930 | A1 | 9/2007 | Chua et al. |
| 2004/0023462 | A1 | 2/2004 | Rotondaro et al. | 2007/0212895 | A1 | 9/2007 | Chua et al. |
| 2004/0028952 | A1 | 2/2004 | Cartier et al. | 2007/0212896 | A1 | 9/2007 | Olsen et al. |
| 2004/0029321 | A1 | 2/2004 | Ang et al. | 2007/0218623 | A1 | 9/2007 | Chua et al. |
| 2004/0033698 | A1 | 2/2004 | Lee et al. | 2008/0032510 | A1 | 2/2008 | Olsen |
| 2004/0036111 | A1 | 2/2004 | Nishikawa et al. | 2008/0038463 | A1 | 2/2008 | Chen et al. |
| 2004/0038486 | A1 | 2/2004 | Chua et al. | 2008/0041307 | A1 | 2/2008 | Nguyen et al. |
| 2004/0038487 | A1 | 2/2004 | Olsen | 2008/0041313 | A1 | 2/2008 | Chen et al. |
| 2004/0038554 | A1 | 2/2004 | Ahn et al. | 2008/0044569 | A1 | 2/2008 | Myo et al. |
| 2004/0040501 | A1 | 3/2004 | Vaartstra | 2008/0102203 | A1 | 5/2008 | Wu et al. |
| 2004/0043149 | A1 | 3/2004 | Gordon et al. | 2008/0102208 | A1 | 5/2008 | Wu et al. |
| 2004/0043569 | A1 | 3/2004 | Ahn et al. | 2008/0107809 | A1 | 5/2008 | Wu et al. |
| 2004/0043630 | A1 | 3/2004 | Vaarsira et al. | 2008/0268171 | A1 | 10/2008 | Ma et al. |
| 2004/0046197 | A1 | 3/2004 | Basceri et al. | 2008/0274299 | A1 | 11/2008 | Chen et al. |
| 2004/0048491 | A1 | 3/2004 | Jung et al. | | | | |
| 2004/0051152 | A1 | 3/2004 | Nakajima | | | | |

FOREIGN PATENT DOCUMENTS

| | | |
|---|---|---|
| EP | 0 847 079 | 6/1998 |
| EP | 1 126 046 | 8/2001 |
| EP | 1 146 141 | 10/2001 |
| EP | 1170804 | 1/2002 |
| EP | 1 321 973 | 6/2003 |
| GB | 2355727 | 5/2001 |
| JP | 59174535 | 10/1984 |
| JP | 2001-172767 | 6/2001 |
| JP | 2002-060944 | 2/2002 |
| JP | 2002-69641 A | 3/2002 |

| | | | |
|---|---|---|---|
| 2004/0053472 | A1 | 3/2004 | Kiryu et al. |
| 2004/0053484 | A1 | 3/2004 | Kumar et al. |
| 2004/0094808 | A1 | 5/2004 | Joshi et al. |
| 2004/0135180 | A1 | 7/2004 | Makita |
| 2004/0142577 | A1 | 7/2004 | Sugawara et al. |
| 2004/0175961 | A1 | 9/2004 | Olsen |
| 2004/0198069 | A1 | 10/2004 | Metzner et al. |
| 2004/0209468 | A1 | 10/2004 | Kumar et al. |
| 2004/0216670 | A1 | 11/2004 | Gutsche et al. |
| 2004/0242021 | A1 | 12/2004 | Kraus et al. |
| 2005/0009358 | A1 | 1/2005 | Choi et al. |

| | | |
|---|---|---|
| JP | 2002-93804 | 3/2002 |
| JP | 2002-167672 | 6/2002 |
| JP | 2002-172767 | 6/2002 |
| JP | 2001-111000 | 12/2002 |
| TW | 386267 | 4/2000 |
| TW | 480569 | 3/2002 |
| TW | 490765 | 6/2002 |
| TW | 556268 | 10/2003 |
| WO | WO 99/29924 | 6/1999 |
| WO | WO 00/13235 | 3/2000 |
| WO | WO 00/54320 | 9/2000 |
| WO | WO 00 70674 | 11/2000 |
| WO | WO 01/15220 | 3/2001 |
| WO | WO 01 25502 | 4/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29891 A1 | 4/2001 |
| WO | WO 01/29893 | 4/2001 |
| WO | WO 01 40541 | 6/2001 |
| WO | WO 01/66832 | 9/2001 |
| WO | WO 01 62390 | 11/2001 |
| WO | WO 01/99166 | 12/2001 |
| WO | WO 02/01628 | 1/2002 |
| WO | WO 02 09167 | 1/2002 |
| WO | WO 02 27063 | 4/2002 |
| WO | WO 02 43115 | 5/2002 |
| WO | WO 02/45167 | 6/2002 |

OTHER PUBLICATIONS

"Nitridation of Hafnium Silicate Thin Films", Chatham, Hood; et al., Mat. Res. Soc. Symp. Proc. vol. 811, Apr. 12-16, 2004. D7.5.1.

"Interval Annealing During Alternating Pulse Deposition", Conley. J.F.; et al., Mat. Res. Soc. Symp. Proc. vol. 811, Apr. 12-16, 2004. D1.3.1.

Ho, et al., "Suppressed crystalization of Ht-based gate dielectrics by controlled addition of Al2O3 using atomic layer deposition", Applied Physics Letters, American Institute of Physics, New York, US, vol. 81, No. 22, Nov. 25, 2002, pp. 4218-4220.

Kawahara, et al., "Effects of Hl sources, oxidizing agents, and NH3 radicals on properties of HfAlOx films prepared by atomic layer deposition", IWGI 2003, Tokyo, Nov. 6, 2003. pp. 32-37.

Kukli, et al., "Atomic Layer Deposition of Hafnium Dioxide Films from Hafnium Tetrakis(ethyimethylamide) and Water", Chemical Vapor Deposition, VCH Publishers, Weinheim, DE, vol. 8, No. 5, Sep. 2002, pp. 199-204.

Ohshita, et al., "Hf1-xSixO2 deposition by metal organic chemical vapor deposition using the Hf)NEt2)4/SiH(NEl2)3/O2 gas system", Preparation and Characterization, Elsevier Sequioa, NL, vol. 416, No. 1-2, Sep. 2, 2002, pp. 208-211.

Visokay, et al., "Application of HlSiON as a gate dielectric material", Applied Physics Letter, American Institute of Physics, New York, US, vol. 80, No. 17, Apr. 29, 2002, pp. 3183-3185.

Hwang, et al. "Nanometer-Size y-PbO2-type TiO2 in Garnet: A Thermobarometer for Ultrahigh-Pressure Metamorphism," Science Vo. 288 (Apr. 14, 2000).

Argarwal, et al. "Challenges in Integrating the High-K Gate Dielectric Film to the Conventional CMOS Process Flow," Mat. Sec. Soc. Sump. Proc. vol. 670 (2001).

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Nilnisto. et al. "Synthesis of oxide thin films and overlayers by atomic layer epitaxy for advance applications," Materials Science and Engineering B41 (1996) 23-29.

Hendrix, et al., "Composition Control of Hl1-xSixO2 Films Deposited on Si by Chemical-vapor Deposition Using Amide Precursors," Applied Physics Letters, vol. 80, No. 13 (Apr. 1, 2002).

Cheon, et al. "Gas Phase Photoproduction of Diatomic Metal Nitrides During Metal Nitride Laser Chemical Vapor Deposition," Inorg. Chem. 1999, 38, 2238-2239.

Ohshita, et al. "HfO2 Growth by Low-pressure Chemical Vapor Deposition Using the Hf(N(C2H5)2)4/O2 Gas System," Journal of Crystal Growth 233 (2001) 292-297.

Balog, et al. "Chemical Vapor Deposition and Characterization of HfO2 Films from Organo-Hafnium Compounds," Thin Solid Films, 41 (1977) 247-259.

Ritala. et al. Acad. Sci. Fenn. Ser. A il. Chemica 257 (1994) pp. 1-48.

Kattelus, et al. "Electrical Properties of Tantalum Based Composite Oxide Films," Mat. Res. Soc. Symp. Proc., 284 (1993) 511-516.

Kuldi, et al. "Taitoring the Dielectric Properties of HfO2-Ta2O5 Nanolaminates," Applied Physics Letters, vol. 68, No. 26 (Jun. 24, 1996), pp. 3737-3739.

Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

George, et al. "Surface Chemistry for Atomic Layer Growth," J. Phys. Chem. (1996), 100, 13121-13131.

Niinisto, et al. "Synthesis of Oxide Thin Films and Overlayers by Atomic Layer Epitaxy for Advanced Applications," Materials Science and Engineering B41 (1996) 23-29.

Applied Materials Instruction Manual, "AMP 3300 Plasma I - Low Temperature Nitride Reactor System", Semiconductor Systems Division, Protective Order - Civil No. 02-CV-3457, dated Jan. 18, 1979.

H. Nakanishi et al., "Studies on $SiO_2$ $SiO_2$ Bonding with Hydrofluoric Acid---Room Temperature and Low Stress Bonding Technique for Mems---"; IEEE, 1998, pp. 609-614.

Kasprzak et al., "Near-Ideal Si-$SiO_2$ Interfaces", IBM J. Res. Develop, vol. 24, No. 3 May 1980, pp. 348-352.

D.R. Cote et al., "Plasma-Assisted Chemical Vapor Deposition of Dielectric Thin Films for ULSI Semiconductor Circuits", IBM J. Res. Develop, vol. 43, No. 1/2, Jan./Mar. 1999, pp. 5-38.

H. F. Okorn-Schmidt, "Characterization of Silicon Surface Preparation Processes for Advanced Gate Dlelectrics", IBM J. Res. Develop, vol. 43, No. 3, May 1999, pp. 351-365.

Y. Kuo et al., "Plasma Processing in the Fabrication of Amorphous Silicon Thin-Films-Transistor Arrays", IBM J. Res. Develop, vol. 43, No. 1/2, Jan./Mar. 1999, pp 73-88.

H. Carre et al., "Semiconductor Manufacturing Technology at IBM", IBM J. Res. Develop, vol. 26, No. 5, Sep. 1982, pp. 528-531.

R. H. Collins et al., "Silicon Process Technology for Monlithic Memory", IRM J. Res. Develop, Jan. 1972, pp. 2-10.

A. T. Fromhold, Jr. et al., "Oxide Growth in an rf Plasma", J. Appl. Phys. 51(12), Dec. 1980, pp. 6377-6392.

P.K. Roy et al., "Stacked High-ε Gate Dielectric for Gigascale Integrated of Metal-Oxide-Semiconductor Technologies", Applied Physics Letters, vol. 72, No. 22, Jun. 1, 1998, pp. 2835-2837.

D. W. Hess, "Plasma-Assisted Oxidation Anodization, and Nitridation of Silicon", IBM J. Res. Develop, vol. 43, No. 1/2, Jan./Mar. 1999, pp. 127-145.

S.A. Nelson et al., "A Structural and Electrical Comparison of Thin SiO2 Films Grown on Silicon by Plasma Anodization and Rapid Thermal Processing to Furnace Oxidation", Applied Physics Letters, vol. 63, No. 10, May 15, 1988, pp. 5027-5035.

S. Taylor et al., "a Review of the Plasma Oxidation of Silicon and its Applications", Semiconductor Science Tech. vol. 8, 1993, pp. 1426-1433, ( Received Nov. 5, 1992.).

P. Freidal, et al., "Review of Oxidation Processes in Plasmas", J. Physics Chem. Solids, vol. 44, No. 5, pp. 353-364, 1983.

Y. Kawai, et al., "Ultra-Low-Temperature Growth of Jigh-Integrity Gate Oxide Films by Low-Energy Ion-Assisted Oxidation", Applied Physics Letters, vol. 64, No. 17, Apr. 25, 1994, pp. 2223-2225.

Deen, et al. Proceedings of the Symposium on "Silicon Nitride and Silicon Dioxide Thin Insulating Films", 1994, Eletrochemical Society, Inc. vol. 97-10 pp. 229-243.

D.L. Pulfrey, et al., "Preparation and Properties of Plasma-Anodized Silicon Dioxide Films", Solid State Electronics, 1974, vol. 17, pp. 627-632, Received on (Sep. 1973).

S. Gourrier, et al., "Review of Oxide Formation in a Plasma", Plasma Chemistry and Plasma Processing vol. 1, No. 3, 1982, pp. 217-232 (Received Jan. 19, 1981).

D.L. Pulfrey, et al., "The Anodization of Si in an RF Plasma", *Solid State Science and Technology*, 1974, vol. 120, No. 11, pp. 1529-1535, Nov. 1972.

A. Reisman, "Assisted Oxidatiion and Annealing in VLSI and ULSI", *Department of Electrical and Computer Engineering*, 1986, pp. 364-378.

John F. O'Hanlon, "Gas Discharge Anodization", *Oxides and Oxide Films*, vol. 5, A.K. Vijh, Ed., Marcel Dekker, New York, 1977, *IBM Corporation*, Chpt. 2, pp. 105-166.

C.J. Dell'Oca, et al., "Anodic Oxide Films", *Physics of Thin Films*, vol. 6, H. Francombe and R. W. Hoffmann, Eds., Academic Press, Inc., New York, 1971, pp. 1-79.

Nelson et al., "Thin Silicon Oxides Grown by Low-Temperature RF Plasma Anodization and Deposition", *Applied Physics Letters*, vol. 50, pp. 1095-1097 (1987).

Vossen, et al., "Thin Film Processes", *Academic Press Inc.*, 1978, Chpt II., pp. 24-73.

Oana, Yasuhisa "5.1: Current & Future Technology of Low Temperature Poly-Si TFT - LCDs", Toshiba Corporation, pp. 1-4.

Singer, Peter "High-K, Metal Gates a 'Go' for 45 nm", Semiconductor International Reed Business Information 2007.

U.S. Appl. No. 60/326,830 filed on Oct. 2, 2001.

\* cited by examiner

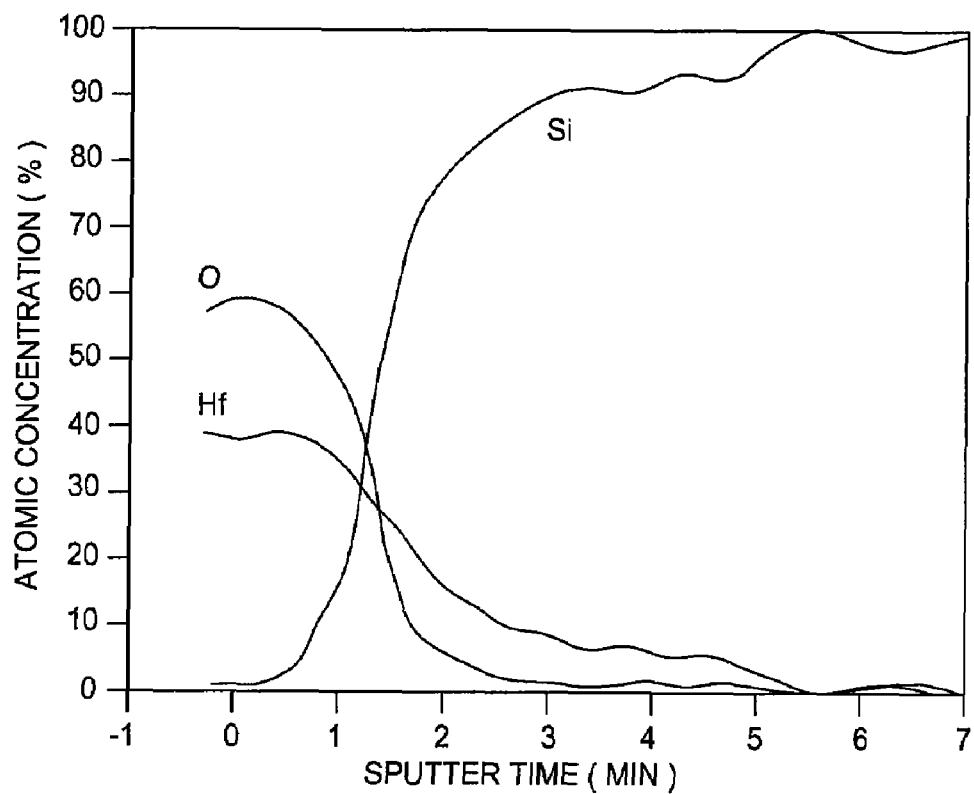
FIG. 6
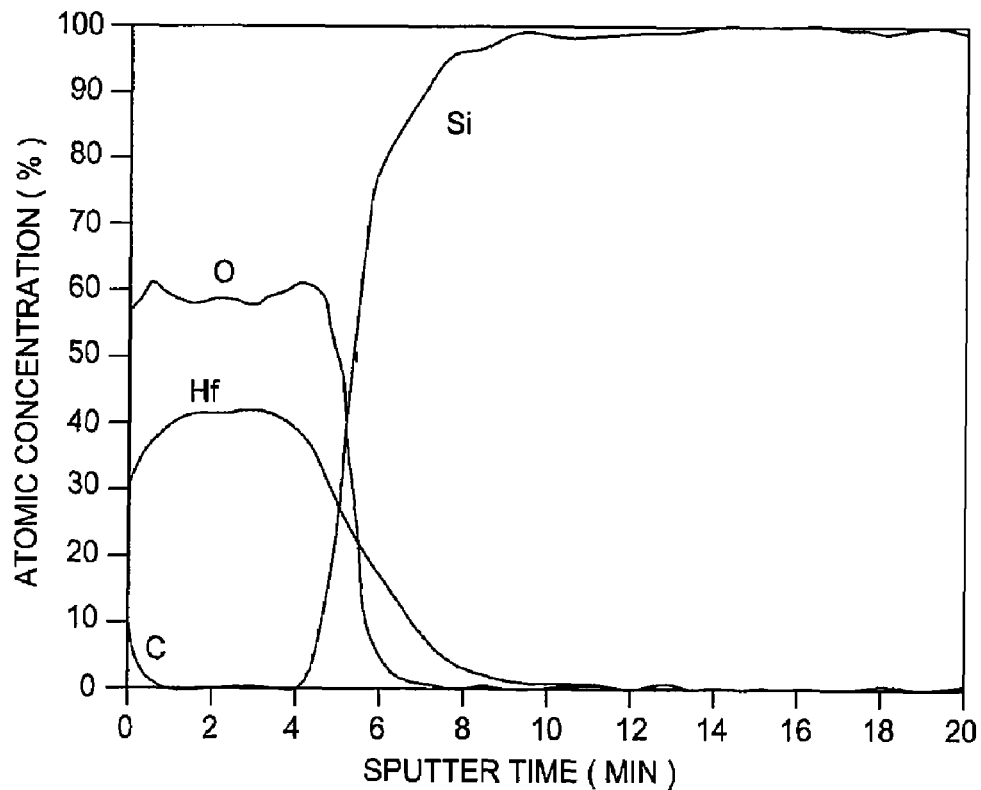
FIG. 7 (COMPARISON)

ALD METAL OXIDE DEPOSITION PROCESS USING DIRECT OXIDATION

CROSS-REFERENCE TO RELATED APPLICATIONS

This application is a divisional application of co-pending U.S. patent application Ser. No. 10/247,103, filed Sep. 19, 2002, which claims benefit to U.S. Provisional Application Ser. No. 60/388,929, filed Jun. 14, 2002, both of which are incorporated by reference herein.

BACKGROUND OF THE INVENTION

1. Field of the Invention

Embodiments of the present invention relate to deposition methods for forming thin films of metal compounds, such as metal oxides or metal nitrides, on substrates for use in manufacturing semiconductor devices, flat-panel display devices, and other electronic devices.

2. Description of the Related Art

In the field of semiconductor processing, flat-panel display processing or other electronic device processing, chemical vapor deposition (CVD) has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are contemplated. Accordingly, conformal deposition of materials to form these devices is necessary.

While conventional CVD has proven successful for device geometries and aspect ratios up to 0.15 microns, the more aggressive device geometries require new, innovative deposition techniques. Techniques that are receiving considerable attention include rapid cycle (pulsed) CVD and atomic layer deposition (ALD). In such schemes, reactants are introduced sequentially into a processing chamber where each reactant adsorbs onto the surface of the substrate where a surface reaction occurs. A purge step is typically carried out between the delivery of each reactant gas. The purge step may be a continuous purge with the reactant gases or a pulse purge between the delivery of the reactant gases.

Deposition of metal compounds from metal organic compounds typically results in trace amounts of carbon in the deposited film. The carbon is introduced into the film from the organic groups on the metal organic compound or a solvent such as toluene that may be added to assist in vaporizing the metal organic compound, or both. Although ALD enhances molecular reactions at the surface of the substrate between the metal organic precursors and reactive gases, the process temperatures and reaction times used for ALD typically do not reduce the carbon content below detectable limits. The residual carbon typically is an impurity that may migrate to surrounding layers.

U.S. Pat. No. 6,200,893, entitled "Radical-assisted Sequential CVD," describes a method for CVD deposition on a substrate where radical species such as hydrogen and oxygen or hydrogen and nitrogen are introduced into a processing chamber in an alternating sequence with a precursor. Each compound, the radical species and the precursor, are adsorbed onto the substrate surface. The result of this process is twofold; the components react with each other, as well as prepare the substrate surface with another layer of compound for the next step. By repeating the cycles, a film of desired thickness is produced. In a preferred embodiment the depositions from the molecular precursor are metals, and the radicals in the alternate steps are used to remove ligands left from the metal precursor reactions, as well as to oxidize or nitridize the metal surface in subsequent layers. However, the reference does not address removal of carbon from metal compounds produced from metal organic compounds.

Therefore, there is a need for a process for depositing metal compounds such as metal oxides and metal nitrides from metal organic compounds to provide thin films that do not have detectable carbon.

SUMMARY OF THE INVENTION

The present invention provides deposition processes in which metal organic compounds comprising the structure $(R'RN)_nM$, where n=1-4, are sequentially deposited on a substrate surface and reacted with ozone or a reactive oxygen or nitrogen species formed in a remote plasma chamber. Atomic layer deposition is the preferred deposition process and is obtained by controlling processing conditions such as temperature and pulse cycles. The metal organic compounds preferably exist in a gaseous state at process conditions and can be vaporized without addition of solvents.

An exemplary embodiment of the invention deposits surprisingly uniform films of hafnium oxide from compounds that include the structure $(R'RN)_4Hf$, wherein either or both of R and R' is an alkyl group having from one to four carbon atoms, and where R and R' may be the same group or may be different groups. A preferred compound is tetrakis(diethylamido) hafnium (TDEAH). In a pulsed atomic layer deposition process, the TDEAH is adsorbed on a substrate surface at a temperature of less than 220° C. and then reacted with ozone or oxygen radicals generated in a remote plasma chamber. A pulse time of about 12 seconds or less significantly and surprisingly provides uniform hafnium oxide film deposition which can be used to form conventional semiconductor films such as high k gate dielectric layers or high k capacitor dielectric layers.

BRIEF DESCRIPTION OF THE DRAWINGS

FIG. 6 shows that carbon is not detectable in the hafnium oxide film using the ALD method of the present invention; and FIG. 7 (comparison) shows that carbon is detectable in a hafnium oxide film produced from the precursor of FIG. 2 using MOCVD.

DETAILED DESCRIPTION OF THE INVENTION

Embodiments of the present invention relate to an atomic layer deposition or a rapid chemical vapor deposition process for forming a thin layer of a metal compound on a substrate.

A metal organic precursor comprising the structure $(R'RN)_n$ M where $n=1-4$, and where at least one of R and R' is an organic group, is introduced into a processing chamber, adsorbed on a substrate surface, then reacted with ozone or with another reactive oxygen species formed in a remote plasma chamber.

Figure 1:
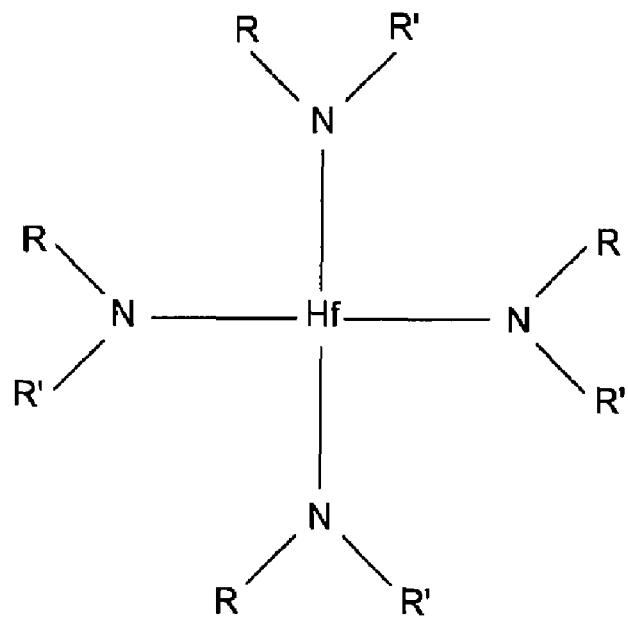
FIG. 1 is a generic structure for tetrakis(dialkylamido) hafnium compounds which are preferred metal organic precursors for the first and second embodiments of the present invention.
Figure 2:
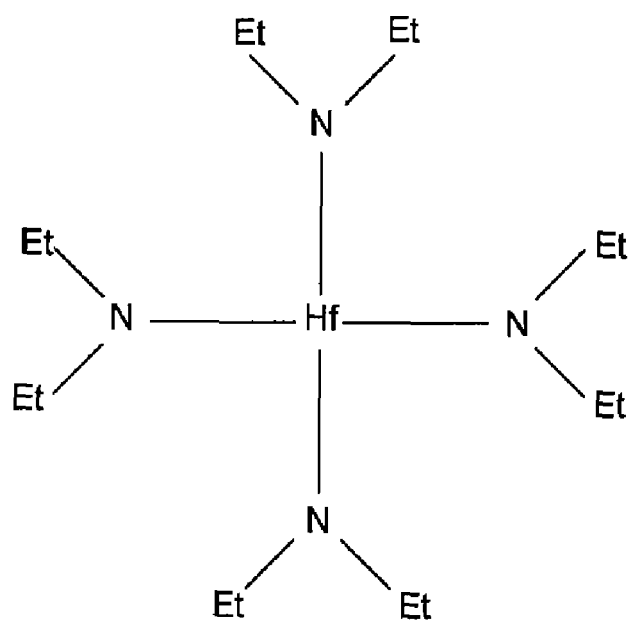
FIG. 2 is tetrakis(diethylamido) hafnium (TDEAH), a compound used in the examples of the present invention.

The deposited metal compounds do not contain detectable amounts of carbon. Removal of detectable carbon is aided by the absence of solvents and excess ligands in the metal organic precursors. The preferred metal organic precursors are hafnium compounds having the structure shown in FIG. 1 wherein both R and R' are an alkyl group having from one to four carbon atoms. Most preferably, R and R' are the same alkyl group. The most preferred metal organic compounds include tetrakis(diethylamido) hafnium (TDEAH), which is shown in FIG. 2 and is commercially available.

In order to form a conformal film on a substrate from TDEAH by atomic layer deposition, the substrate is heated to a temperature of between about 150° C. and about 220° C. The TDEAH is pulsed into the chamber through the gas delivery system using a carrier gas, such as nitrogen or argon, at a pressure from 0.1 Torr to 10 Torr. The pulse of TDEAH requires less than 12 seconds to deposit an adequate amount of TDEAH on the substrate surface under the conditions described; however one skilled in the art recognizes that the TDEAH pulse need only be long enough so that substantially a monolayer of TDEAH is deposited. Following the pulse of TDEAH, the carrier gas/TDEAH flow is discontinued, and a pulse of a purge gas, such as nitrogen, helium or argon, is introduced. The pulse of the purge gas may last for about 12 seconds or less, and need only be long enough to clear the excess TDEAH from the chamber.

Next, the purge gas pulse is terminated, and a reactive gas comprising ozone or other reactive oxygen species from a remote plasma chamber is pulsed into the chamber with a carrier gas. For reactive oxygen, the carrier gas is preferably argon or helium, either of which assists in maintaining a stable oxygen plasma. It takes a reactive gas/carrier pulse of less than about 12 seconds to react with the TDEAH to form hafnium oxide or hafnium nitride, but again, the pulse need only be long enough so that substantially a monolayer of reactive oxygen is deposited. After the reactive oxygen gas/carrier pulse, another pulse of purge gas is introduced into the chamber, and, as before, the time of the pulse of the purge gas need only be long enough to clear the unreacted reactive oxygen from the chamber. The pulse of the TDEAH/carrier, the pulse of the first purge gas, the pulse of the reactive oxygen gas/carrier, and the pulse of the second purge gas completes one sequential deposition cycle. The deposition cycles are repeated until a desired thickness of the hafnium oxide or hafnium nitride has been deposited. The time per cycle will vary depending on substrate or chamber size and other hardware parameters, on chamber conditions such as temperature and pressure and on the selection of precursor and reactive gas.

Figure 3:
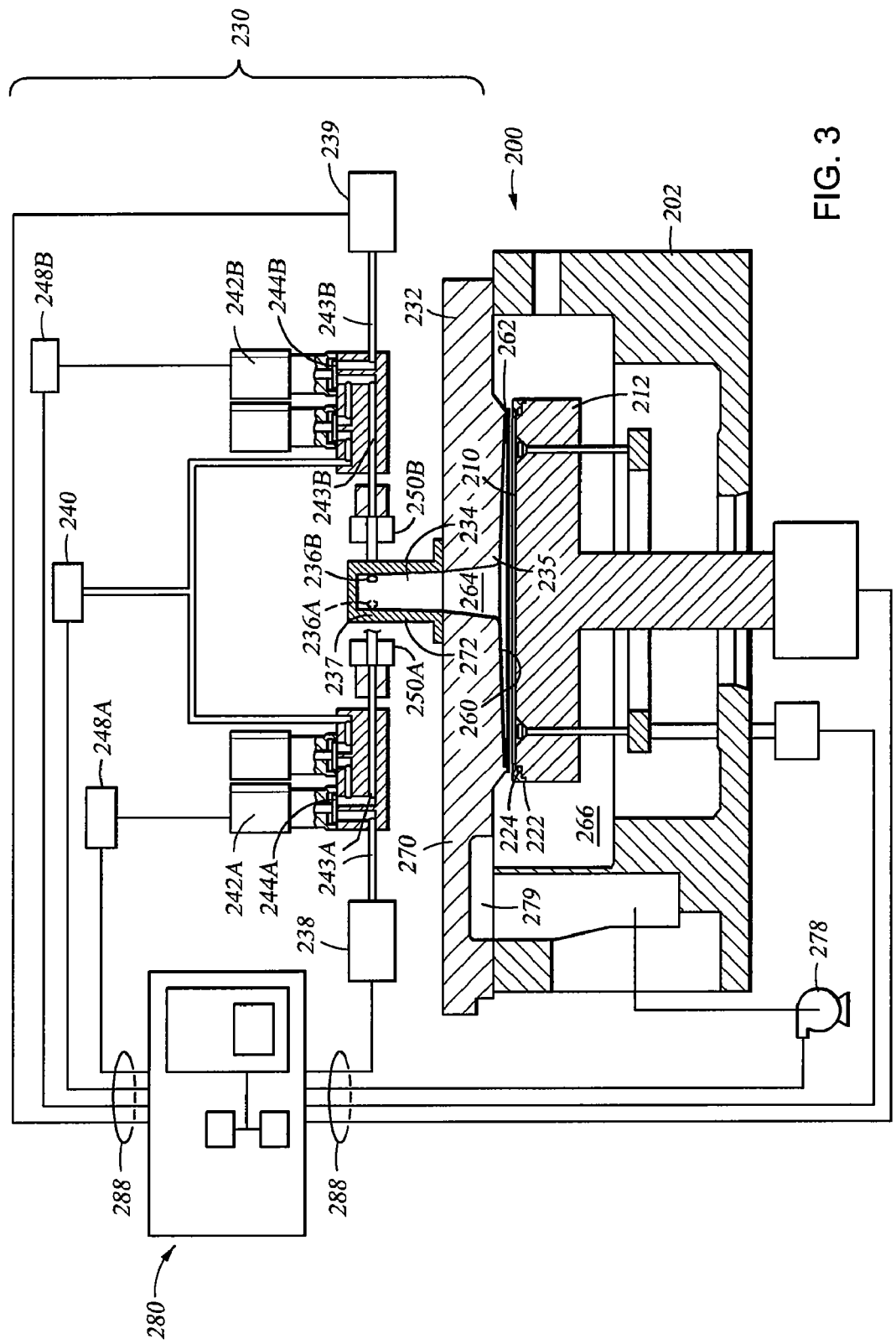
FIG. 3 is a cross sectional view of one processing chamber which can be used to advantage to deposit a metal compound according to embodiments of the invention.

FIG. 3 is a schematic cross-sectional view of one embodiment of a processing chamber 200 which can be used to form films according to embodiments described herein. The chamber 200 includes a chamber body 202 and a movable substrate support 212 disposed in the chamber to support a substrate 210. The substrate support 212 may include a vacuum chuck, an electrostatic chuck, or a clamp ring for securing the substrate 210 to the substrate support 212 during processing. The substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 which provides a purge gas to a peripheral portion of the substrate 210 to prevent deposition thereon.

The chamber 200 includes a vacuum system 278 in communication with a pumping channel 279 to evacuate any desired gases from the chamber 200 and to help maintain a desired pressure or a desired pressure range inside a pumping zone 266 of the chamber 200.

A gas delivery apparatus 230 is disposed at an upper portion of the chamber body 202 to introduce the metal precursors, the reactive gases and the purge gases into the chamber 200. The gas delivery apparatus 230 comprises a chamber lid 232 which includes an expanding channel 234 and a bottom surface 260. The bottom surface 260 is sized and shaped to substantially cover a substrate 210 disposed on the substrate support 212. The expanding channel 234 has gas inlets 236A, 236B to provide gas flows from two similar valves 242A, 242B via valve seat assemblies 244A, 244B and delivery lines 243A, 243B. The gas flows from the valves 242A, 242B may be provided together and/or separately. The valves 242A, 242B may be pneumatically actuated or may be electrically actuated. Programmable logic controller 248A, 248B may be coupled to the valves 242A, 242B to control actuation of the valves 242A, 242B. An electrically actuated valve typically requires the use of a driver coupled between the valve and the programmable logic controller. The valves 242A, 242B may be zero dead volume valves to enable rapid flushing of a reactant gas from the delivery lines of the valve 242A, 242B.

Valves 242A and 242B are each coupled to separate precursors. Each is coupled to a purge gas source, preferably the same purge gas source. For example, valve 242A is coupled to precursor gas source 238 and valve 242B is coupled to reactant gas source 239, and both valves 242A, 242B are coupled to purge gas source 240. Each valve 242A, 242B may be adapted to provide a combined gas flow and/or separate gas flows of the precursor gas source 238 or reactant gas source 239 and the purge gas source 240. The reactant gas source 239 includes remote plasma generation such as a microwave chamber to generate reactive gas species when desired.

In reference to valve 242A, one example of a combined gas flow of the precursor gas source 238 and the purge gas source 240 provided by valve 242A comprises a continuous flow of a purge gas from the purge gas source 240 and pulses of a reactant gas from the precursor gas source 238. In reference to valve 242A, one example of separate gas flows of the reactant gas source 238 and the purge gas 240 provided by valve 242A comprises pulses of a purge gas from the purge gas source 240 and pulses of a reactant gas from the reactant gas source 238.

The delivery lines of the valves 242A, 242B may be coupled to the gas inlets 236A, 236B through gas conduits 250A, 250B. Each gas conduit 250A, 250B and gas inlet 236A, 236B may be positioned in any relationship to the expanding channel 234. Each gas conduit 250A, 250B and gas inlet 236A, 236B are preferably positioned normal (in which $+\beta$, $-\beta=$ to 90°) to the longitudinal axis of the expanding channel 234 or positioned at an angle $+\beta$ or an angle $-\beta$ (in which $0°<+\beta<90°$; $0°<-\beta<90°$) from a centerline of the gas conduit 250A, 250B to the longitudinal axis of the expanding channel 234. Therefore, the gas conduit 250A, 250B may be positioned horizontally normal to the longitudinal axis of the expanding channel 234, may be angled downwardly at an angle $+\beta$, or may be angled upwardly at an angle $-\beta$ to provide a gas flow towards the walls of the expanding channel 234 rather than directly downward towards the substrate 210 which helps reduce the likelihood of blowing off reactants adsorbed on the surface of the substrate 210. In addition, the diameter of the gas conduits 250A, 250B may be increasing from the delivery lines 243A, 243B of the valves 242A, 242B to the gas inlets 236A, 236B to help reduce the velocity of the gas flow prior to its entry into the expanding channel 234. For example, the gas conduits 250A, 250B may comprise an inner diameter which is gradually increasing or may comprise a plurality of connected conduits having increasing inner diameters. The expanding channel 234 comprises a channel which has an inner diameter which increases from an upper portion 237 to a lower portion 235 adjacent the bottom surface 260 of the chamber lid 232. In one aspect, the diameter of the expanding channel 234 is gradually increasing from the upper portion 237 to the lower portion 235 of the expanding channel 234 to allow less of an adiabatic expansion of a gas through the expanding channel 234 which helps to control the temperature of the gas. In one embodiment, the gas inlets 236A, 236B are located adjacent the upper portion 237 of the expanding channel 234.

At least a portion of the bottom surface 260 of the chamber lid 232 from the expanding channel 234 may be downwardly slopping or funnel shaped to help provide an improved velocity profile of a gas flow from the expanding channel 234 across the surface of the substrate 210 (i.e., from the center of the substrate to the edge of the substrate). In one aspect, the bottom surface 260 is downwardly sloping to help reduce the variation in the velocity of the gases as it travels between the bottom surface 260 of the chamber lid 232 and the substrate 210 to help provide uniform exposure of the surface of the substrate 210 to a precursor or reactant gas.

The chamber lid 232 may have a choke 262 at a peripheral portion of the chamber lid 232 adjacent the perimeter of the substrate 210. The choke 262 may comprise any circumferential downwardly extending protrusion. The choke 262 helps provide a more uniform pressure distribution within the volume or a reaction zone 264 defined between the chamber lid 232 and the substrate 210 by isolating the reaction zone 264 from the non-uniform pressure distribution of the pumping zone 266.

In one aspect, since the reaction zone 264 is isolated from the pumping zone 266, a minimal amount of gas adequately fills the reaction zone 264 to ensure sufficient exposure of the substrate 210 to the gas. In conventional chemical vapor deposition, a chamber is required to provide a combined flow of reactants simultaneously and uniformly to the entire surface of the substrate in order to ensure that the co-reaction of the reactants occur uniformly across the surface of the substrate. In an atomic layer deposition based cyclical processing system, reactants are introduced sequentially into the chamber to provide adsorbtion of alternating thin layers of the reactants onto the surface of the substrate. Instead, a flow of a reactant needs to be provided repetitively in an amount that is sufficient to adsorb a thin layer of the reactant on the surface of the substrate. Since the reaction zone 264 may comprise a smaller volume when compared to the inner volume of a conventional CVD chamber, a smaller amount of gas is required to fill the reaction zone 264 for a particular process in an atomic layer deposition sequence. Because of the smaller volume of the reaction zone 264, less gas, whether a deposition gas or a purge gas, is necessary to be flowed into the chamber 200. Therefore, the throughput of the chamber 200 is greater and the waste may be minimized due to the smaller amount of gas used reducing the cost of operation.

The chamber lid 232, as shown, includes a cap portion 272 and a chamber plate portion 270 in which the cap portion 272 and the chamber plate portion 270 form the expanding channel 234. An additional plate may be optionally disposed between the chamber lid portion 270 and the cap portion 272. In other embodiments, the expanding channel 234 may be made integrally from a single piece of material.

The chamber lid 232 may include cooling elements and/or heating elements depending on the particular gas being delivered therethrough (not shown). Controlling the temperature of the chamber lid 232 may be used to prevent gas decomposition, deposition, or condensation on the chamber lid 232. For example, water channels may be formed in the chamber lid 232 to cool the chamber lid 232. In another example, heating elements may be embedded or may surround components of the chamber lid 232 to heat the chamber lid 232. In one embodiment, components of the chamber lid 232 may be individually heated or cooled. For example, referring to FIG. 3, the chamber lid 232 may comprise a chamber plate portion 270 and a cap portion 272 in which the chamber plate portion 270 and the cap portion 272 form the expanding channel 234. The cap portion 272 may be maintained at one temperature range and the chamber lid 232 may be maintained at another temperature range. For example, the cap portion 272 may be heated by being wrapped in heater tape or by using another heating device to prevent condensation of reactant gases and the chamber plate portion 270 may be maintained at ambient temperature. In another example, the cap portion 272 may be heated and the chamber plate portion 270 may be cooled with water channels formed therethrough to prevent thermal decomposition of reactant gases on the chamber plate portion 270.

The chamber lid 232 may be made of stainless steel, aluminum, nickel-plated aluminum, nickel, or other suitable materials. In one embodiment, the cap portion 272 comprises stainless steel and the chamber plate portion 270 comprises aluminum. In one embodiment, the additional plate comprises stainless steel.

A control unit 280 may be coupled to the chamber 200 for controlling process conditions. For example, the control unit 280, may be configured to control flow of various process gases and purge gases from gas sources 238, 239, 240 through the valves 242A, 242B during different stages of a substrate process sequence. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 3. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing, such as wafer transport, temperature control, chamber evacuation, among other activities, some of which are described elsewhere herein.

In operation, a first gas flow may be injected into the expanding channel 234 of the chamber 200 by valve 242A together or separately (i.e., pulses) with a second gas flow injected into the chamber 200 by valve 242B. The first gas flow may comprise a continuous flow of a purge gas from purge gas source 240 and pulses of a precursor gas from precursor gas source 238 or may comprise pulses of a reactant gas from reactant gas source 239 and pulses of a purge gas from purge gas source 240. The flows of gas travel through the expanding channel 234 as a vortex flow pattern which provides a sweeping action across the inner surface of the expanding channel 234. The vortex flow pattern dissipates to a downwardly flow toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas and by-products flow into the pumping channel 279 and are exhausted from the chamber 200 by a vacuum system 278. In one aspect, the gas flows proceed through the expanding channel 234 and between the surface of the substrate 210 and the bottom surface 260 of the chamber lid 232 proceeds in a laminar manner which aids in an efficient exposure of a reactant gas to the surface of the substrate 210 and efficient purging of inner surfaces of the chamber lid 232.

EXAMPLES

Figure 4:
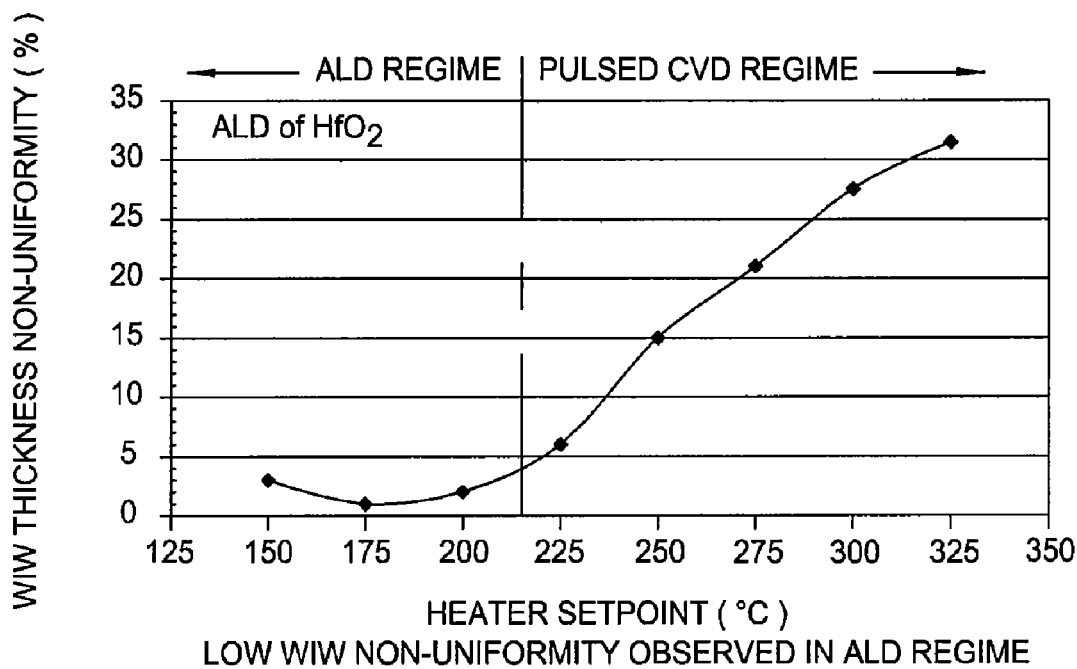
FIG. 4 shows the surprising uniformity of hafnium oxide films deposited by the present invention using TDEAH and further shows the substrate temperatures that produce uniform hafnium oxide films.

Hafnium oxide films were deposited at a chamber pressure of 4 Torr by pulsing TDEAH in a nitrogen carrier for 10 seconds. The chamber was then purged with a pulse of a nitrogen gas for 10 seconds. Next, reactive oxygen and an argon carrier (Ar/O* ratio=1:2) was pulsed to the chamber for 10 seconds. Once the reactive gas/carrier pulse was terminated, a second pulse of nitrogen gas was introduced into the chamber for ten seconds to complete the cycle. This process was repeated for 40 cycles with substrate temperatures ranging from 150° C. to 325° C. The resulting hafnium oxide films were tested for WIW Thickness Non-uniformity and the results are shown in FIG. 4. The results in FIG. 4 show that atomic layer deposition (ALD) occurred at substrate temperatures between 150° C. and about 225° C. while pulsed CVD occurred above 225° C. The ALD films showed excellent uniformity.

Figure 5:
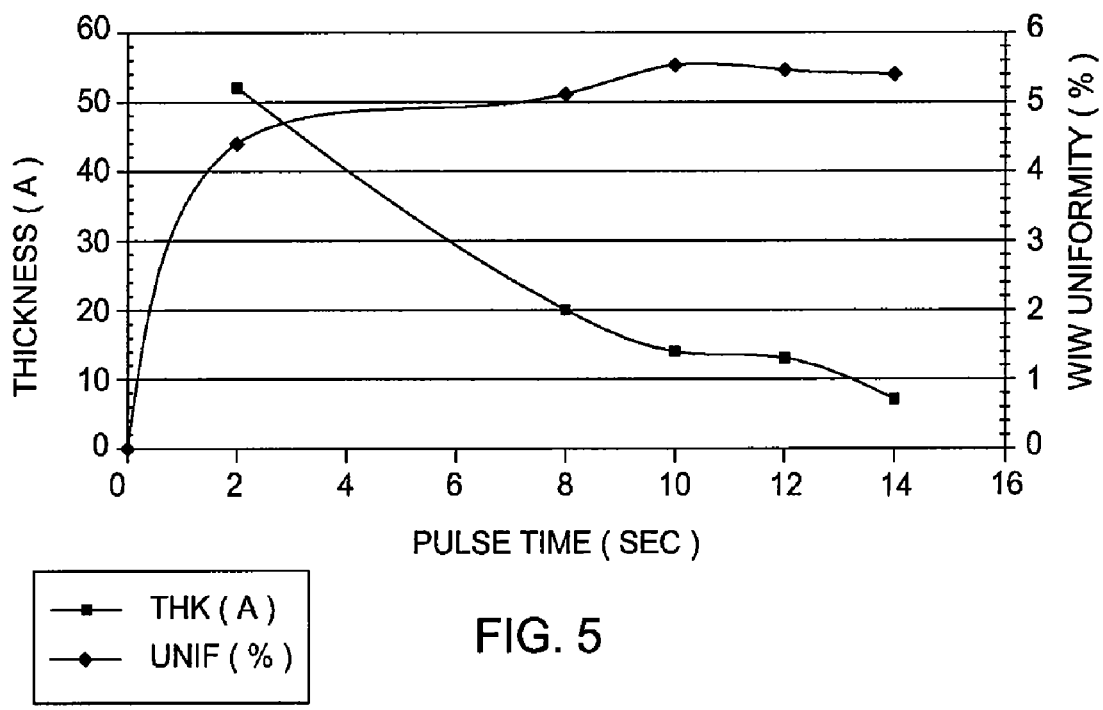
FIG. 5 shows the effect of pulse time on uniformity of the hafnium oxide film of the present invention.

Hafnium oxide films were then deposited at a chamber pressure of 4 Torr and a substrate temperature of 175° C. by pulsing TDEAH and a nitrogen carrier from 2 seconds to 14 seconds. After the TDEAH pulse, a nitrogen gas purge was pulsed into the chamber. For each cycle the nitrogen purge after the TDEAH/carrier pulse was the same length as the TDEAH/carrier pulse. Next, the nitrogen purge was terminated and a plasma of an argon carrier and oxygen (Ar/O* ratio=1:2) was pulsed to the chamber for 2 seconds to 14 seconds, matching the length of the TDEAH/carrier pulse. The cycle was then completed by a second nitrogen purge matching the length of the TDEAH/carrier pulse. The cycle was repeated 40 times and the resulting hafnium oxide films were measured for thickness, in addition to WIW Thickness Non-uniformity. The results are shown in FIG. 5 and show that pulse times from 10 to 14 seconds provide significant improvement in uniformity.

FIG. 6 shows an Auger analysis of atomic concentrations of a hafnium oxide film deposited at a substrate temperature of 175° C. Although not calibrated, the analysis shows that the film contained about 60 atomic percent of oxygen and about 40 atomic percent of hafnium, and did not contain detectable amounts of carbon. The atomic concentration of a hafnium oxide film prepared from the same precursor using a MOCVD process is shown in FIG. 7. The results in FIG. 7 show that the comparison film retained a measurable amount of carbon.

The hafnium oxide films of the invention have utility in conventional devices such as replacing the hafnium oxide films, forming hafnium oxide films, and forming mixed metal films containing hafnium oxide as described in the commonly assigned U.S. Pat. No. 6,858,547, filed Sep. 27, 2002.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed:

1. A method for forming a hafnium material on a substrate, comprising:
    positioning a substrate within a process chamber;
    exposing the substrate to a hafnium precursor comprising the chemical formula $(R'RN)_4Hf$, wherein each R and R' is independently a hydrogen group or an alkyl group having from one to four carbon atoms;
    exposing the substrate to active oxygen species formed by a remote plasma source; and
    exposing the substrate to active nitrogen species.

2. The method of claim 1, wherein the process chamber is pressurized at a pressure of less than about 10 Torr and the substrate is heated to a temperature within a range from about 150° C. to about 225° C.

3. The method of claim 1, wherein a purge gas is pulsed into the process chamber after exposing the substrate to the hafnium precursor and after exposing the substrate to the active oxygen species.

4. The method of claim 1, wherein R or R' is an ethyl group.

5. The method of claim 4, wherein the hafnium precursor is TDEAH.

6. The method of claim 1, wherein the active oxygen species comprises a mixture of argon and oxygen radicals.

7. The method of claim 6, wherein the mixture of argon and oxygen radicals has an argon:oxygen ratio of 1:2.

8. A method for forming a hafnium material on a substrate, comprising:
    positioning a substrate within a process chamber;
    exposing the substrate sequentially to a hafnium precursor and active oxygen species, wherein the hafnium precursor comprises the chemical formula $(R'RN)_4Hf$, each R and R' is independently a hydrogen group or an alkyl group having from one to four carbon atoms, and the active oxygen species comprises ozone or other oxygen radicals; and
    exposing the substrate to active nitrogen species.

9. The method of claim 8, wherein the process chamber is pressurized at a pressure of less than about 10 Torr and the substrate is heated to a temperature within a range from about 150° C. to about 225° C.

10. The method of claim 8, wherein R or R' is an ethyl group.

11. The method of claim 10, wherein the hafnium precursor is TDEAH.

12. The method of claim 8, wherein the active oxygen species comprises a mixture of argon and oxygen radicals.

13. The method of claim 12, wherein the mixture of argon and oxygen radicals has an argon:oxygen ratio of 1:2.

14. A method for forming a hafnium material on a substrate, comprising:
    positioning a substrate within a process chamber;
    exposing the substrate to a process gas comprising a hafnium organic precursor to form a layer of the hafnium organic precursor;
    purging the process chamber with a purge gas;
    exposing the substrate to active oxygen species to form an oxide layer thereon;
    purging the process chamber with the purge gas;

exposing the substrate to the hafnium organic compound to form another layer of the hafnium organic precursor;

purging the process chamber with the purge gas;

exposing the substrate to active nitrogen species generated by a remote plasma source to form a nitride layer thereon; and purging the process chamber with the purge gas.

15. The method of claim 14, wherein the hafnium organic precursor comprises the chemical formula $(R'RN)_4Hf$ and each R and R' is independently a hydrogen group or an alkyl group having from one to four carbon atoms.

16. The method of claim 15, wherein R or R' is an ethyl group.

17. The method of claim 16, wherein the hafnium organic precursor is TDEAH.

18. The method of claim 14, wherein the active oxygen species comprises a mixture of argon and oxygen radicals.

19. The method of claim 18, wherein the mixture of argon and oxygen radicals has an argon:oxygen ratio of 1:2.

20. The method of claim 14, wherein the process chamber is pressurized at a pressure of less than about 10 Torr and the substrate is heated to a temperature within a range from about 150° C. to about 225° C.

* * * * *

UNITED STATES PATENT AND TRADEMARK OFFICE
CERTIFICATE OF CORRECTION

PATENT NO. : 7,569,500 B2
APPLICATION NO. : 11/421283
DATED : August 4, 2009
INVENTOR(S) : Metzner et al.

It is certified that error appears in the above-identified patent and that said Letters Patent is hereby corrected as shown below:

On the title page,
In References Cited (56):

Please delete "2002/0064970 A1 5/2002 Chool et al." and insert --2002/0064970 A1 5/2002 Chooi et al.-- therefor;

Please delete "2002/0182320 A1 12/2002 Lesketa et al." and insert --2002/0182320 A1 12/2002 Leskela et al.-- therefor;

Please delete "2003/0031607 A1 2/2003 Elers et al." and insert --2003/0031807 A1 2/2003 Elers et al.-- therefor;

Please delete "2003/0194859 A1 10/2003 Jeon" and insert --2003/0194853 A1 10/2003 Jeon-- therefor;

Please delete "2004/0016723 A1 1/2004 Byun et al." and insert --2004/0018723 A1 1/2004 Byun et al.-- therefor;

Please delete "2004/0016747 A1 1/2004 Lee et al." and insert --2004/0018747 A1 1/2004 Lee et al.-- therefor;

Please delete "WO 01 62390 11/2001" and insert --WO 01 82390 11/2001-- therefor;

Please delete "Nilnisto. et al. "Synthesis of oxide thin films and overlayers by atomic layer epitaxy for advance applications," Materials Science and Engineering B41 (1996) 23-29." and insert --Niinisto, et al. "Synthesis of oxide thin films and overlayers by atomic layer epitaxy for advance applications," Materials Science and Engineering B41 (1996) 23-29.-- therefor;

UNITED STATES PATENT AND TRADEMARK OFFICE
CERTIFICATE OF CORRECTION

PATENT NO. : 7,569,500 B2
APPLICATION NO. : 11/421283
DATED : August 4, 2009
INVENTOR(S) : Metzner et al.

It is certified that error appears in the above-identified patent and that said Letters Patent is hereby corrected as shown below:

Please delete "Kuldi, et al. "Taitoring the Dielectric Properties of HfO2-Ta2O5 Nanolaminates," Applied Physics Letters, vol. 68, No. 26 (Jun. 24, 1996), pp. 3737-3739." and insert --Kukli, et al., "Tailoring the Dielectric Properties of HfO2-Ta2O5 Nanolaminates." Applied Physics Letters, vol. 68, No. 26 (Jun. 24, 1996), pp. 3737-3739.-- therefor.

Signed and Sealed this

Twenty-ninth Day of September, 2009

David J. Kappos
*Director of the United States Patent and Trademark Office*